United States Patent
Pamarti et al.

(10) Patent No.: US 11,621,669 B2
(45) Date of Patent: Apr. 4, 2023

(54) FAST STARTUP OF CRYSTAL AND OTHER HIGH-Q OSCILLATORS

(71) Applicant: THE REGENTS OF THE UNIVERSITY OF CALIFORNIA, Oakland, CA (US)

(72) Inventors: Sudhakar Pamarti, Irvine, CA (US); Haris Suhail, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 17/583,665

(22) Filed: Jan. 25, 2022

(65) Prior Publication Data

US 2022/0239255 A1 Jul. 28, 2022

Related U.S. Application Data

(60) Provisional application No. 63/142,276, filed on Jan. 27, 2021.

(51) Int. Cl.
  *H03B 5/06* (2006.01)
  *H03B 5/32* (2006.01)
  (Continued)

(52) U.S. Cl.
  CPC .............. *H03B 5/06* (2013.01); *H03B 5/32* (2013.01); *H03B 5/366* (2013.01); *H03L 3/00* (2013.01); *H03B 2200/0094* (2013.01)

(58) Field of Classification Search
  CPC ... H03B 5/06; H03B 5/30; H03B 5/32; H03B 5/326; H03B 5/36; H03B 5/362;
  (Continued)

(56) References Cited

U.S. PATENT DOCUMENTS

| | | | | |
|---|---|---|---|---|
| 4,814,879 A | * | 3/1989 | McNeely | H03L 7/0814 348/E5.009 |
| 5,179,438 A | * | 1/1993 | Morimoto | H03L 7/0816 327/263 |

(Continued)

OTHER PUBLICATIONS

Esmaeelzadeh, Hani et al., "A precisely-timed energy injection technique achieving 58/10/2 µs start-up in 1.84/10/50MHz crystal oscillators," 2017 IEEE Custom Integrated Circuits Conference (CICC), Austin, TX, 2017, pp. 1-4.

(Continued)

*Primary Examiner* — Levi Gannon
(74) *Attorney, Agent, or Firm* — O'Banion & Ritchey LLP; John P. O'Banion (57) ABSTRACT

Oscillator quick-startup circuit and method in which a voltage step is applied to a resonator (crystal) resulting in ringing which is amplified and fed into a locking circuit which locks to it, such as a programmable delay circuit. Once locking is complete, then the circuit is switched into a standalone oscillator mode, having a feedback path, the output of this injection oscillator energizes the resonator for achieving quick startup of a primary oscillator, in response to it automatically adjusting injection oscillator frequency to match the frequency of the resonator. A digital circuit controls the configuring of the circuit for applying the voltage step, adjusting the locking circuit, and then switching into a standalone oscillator mode.

18 Claims, 7 Drawing Sheets

(51) Int. Cl.
*H03L 3/00* (2006.01)
*H03B 5/36* (2006.01)

(58) Field of Classification Search
CPC ........ H03B 5/364; H03B 5/366; H03B 5/368; H03B 2200/0094; H03K 5/13; H03K 5/131; H03K 5/133; H03K 5/134; H03K 5/135; H03K 5/14; H03K 2005/00013; H03K 2005/00019; H03K 2005/00026; H03K 2005/00058; H03K 2005/0015; H03K 2005/00156; H03K 2005/00234; H03K 2005/00241; H03L 3/00
See application file for complete search history.

(56) References Cited

U.S. PATENT DOCUMENTS

| | | | | |
|---|---|---|---|---|
| 6,121,849 | A * | 9/2000 | McCollough | H03L 7/0807 331/34 |
| 6,690,223 | B1 * | 2/2004 | Wan | H03K 5/133 327/251 |
| 6,819,195 | B1 * | 11/2004 | Blanchard | H03B 5/06 331/173 |
| 9,246,435 | B1 * | 1/2016 | Kavousian | H03B 5/364 |
| 10,924,096 | B1 * | 2/2021 | Modi | G06F 1/10 |
| 2003/0231065 | A1 * | 12/2003 | Ito | H03L 7/10 331/1 A |
| 2005/0040862 | A1 * | 2/2005 | Jiguet | H03K 5/135 327/3 |
| 2014/0009234 | A1 * | 1/2014 | Aichner | H03B 5/36 331/49 |
| 2018/0175840 | A1 * | 6/2018 | Todorokihara | H03K 19/21 |

OTHER PUBLICATIONS

Lechevallier, Joeri B. et al., "Fast & Energy Efficient Start-Up of Crystal Oscillators by Self-Timed Energy Injection," in IEEE Journal of Solid-State Circuits, vol. 54, No. 11, Nov. 2019, pp. 3107-3117.

* cited by examiner

FAST STARTUP OF CRYSTAL AND OTHER HIGH-Q OSCILLATORS

CROSS-REFERENCE TO RELATED APPLICATIONS

This application claims priority to, and the benefit of, U.S. provisional patent application Ser. No. 63/142,276 filed on Jan. 27, 2021, incorporated herein by reference in its entirety.

STATEMENT REGARDING FEDERALLY SPONSORED RESEARCH OR DEVELOPMENT

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to rapid start up oscillator circuits, and more particularly to a rapid start oscillator circuit which automatically adjusts injection oscillator frequency to match the resonance frequency.

2. Background Discussion

Low-power consumption is crucial in many electronic applications, such as Internet of Things (IoT) and wearable healthcare monitoring devices where extended battery life and maintenance-free operation which can extend even into several years are required. One of the more effective ways to conserve power is to duty cycle the bulk of power-hungry circuitry. The more rapidly the system can be powered up, perform its function and power down again, the less power will be consumed. However, start-up time and hence duty-cycling in such systems can be limited by the crystal or MEMS oscillators as they require both time and energy to start oscillation. One popular technique pre-energizes the crystal or MEMS (or other high Quality Factor resonator) device using another "injection" oscillator at nominally the same frequency as the crystal resonance to hasten its startup. Such injection type oscillators as ring and relaxation oscillators themselves are known to startup much faster than the high-Quality Factor oscillator of interest. Yet, this technique is often rendered ineffective by inevitable mismatches between the frequencies of the injection oscillator and the crystal (or high Q) resonator. These mismatches are caused by variability induced by process, voltage, temperature, fabrication errors, and other such issues.

Attempts have been made to address these mismatches by (a) sweeping the injection oscillator frequency over a broad range, or (b) dithering it over a broad range, or (c) trimming the frequency error using factory calibration, and/or (d) using temperature compensation techniques. However, despite these efforts, startup time can still be excessive, or in other cases fast startup is only achieved under a very restricted set of conditions, for example having a limited operational range, or other operational limits. Still further, the techniques that have been utilized to address the startup issue are subject to additional penalties which can include higher energy consumption, cost, calibrating/trimming of frequency error, and so forth.

Prior techniques of the author have starting up crystal oscillators in approximately 100 cycles. However, to operate these techniques required that a very precise injection frequency, such as up to +/−6000 ppm be achieved. This accuracy requires factory calibration of the injection frequency source (e.g., a ring oscillator), which must be performed for each circuit chip and is therefore an expensive solution.

Accordingly, a need exists for low cost, low power solutions for achieving rapid oscillator startup. The present disclosure addresses that need and provides additional benefits.

BRIEF SUMMARY

Methods and circuits are described for automatically adjusting the frequency of an injection oscillator to match the oscillator (e.g., crystal) resonance frequency very accurately. This operation is performed prior to starting a high-Q oscillator (e.g., crystal oscillator), by observing the ringing response of the high-Q resonator to a voltage step input and adjusting the frequency of an injection oscillator to match that of the ringing. The presented technology accordingly provides for fast startup of crystal and other high-Q oscillators.

In one embodiment, the delay of a delay-line is adjusted to match the resonance (ringing) period of the resonator, and can be performed in only about 5 cycles. Subsequently, when the matched delay-line is reconfigured in feedback, such as realizing an oscillator (e.g., ring oscillator), its frequency matches the resonant frequency to within sub-1000 ppm. This auto-adjusted injection oscillator is then used to quickly startup the crystal, or other high-Q resonator, by pre-energization. It should be appreciated, however, that any frequency locking block that can detect and lock to an input, retain that information, and produce an output at the same frequency can be utilized according to the present disclosure. By way of example this can be achieved with a digitally-controlled oscillator, which does not need to be reconfigured as a ring oscillator.

In one embodiment of the presented technology, the standalone oscillator (e.g., ring is configured at runtime automatically and therefore each chip does not have to be configured separately. Since the delay line can lock within 10 cycles, it does not incur a significant energy penalty. The delay line can obtain sub 6000 ppm accuracy; whereby extremely fast startup times (plus an additional 10 cycles for the initial locking phase) can be obtained.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only.

DETAILED DESCRIPTION

The technology described in this disclosure enables fast startup of crystal and other high-Q oscillators by automatically adjusting the frequency of the injection oscillator to match the crystal resonance frequency very closely (accurately). It should be appreciated that in the present disclosure, the term high-Q is that of having a high enough Q value such that upon the resonator being triggered it outputs a sufficient duration of ringing to allow locking to be performed by the locking circuit. This operation is performed before starting the oscillator, by observing the ringing response of the crystal, or other high Q resonator, to a voltage step and adjusting the frequency of an injection oscillator to match that of the ringing. By way of example, and not of limitation, this method is carried out by exciting the resonator with a voltage step, locking a low power delay-line to the period of resonator ringing, and reconfiguring the delay-line into the injection oscillator for precisely timed injection with minimal frequency error.

FIG. 1 through FIG. 4 illustrate an embodiment of a circuit 10 and its operational sequence 10, 50, 70 and 90.

Figure 1:
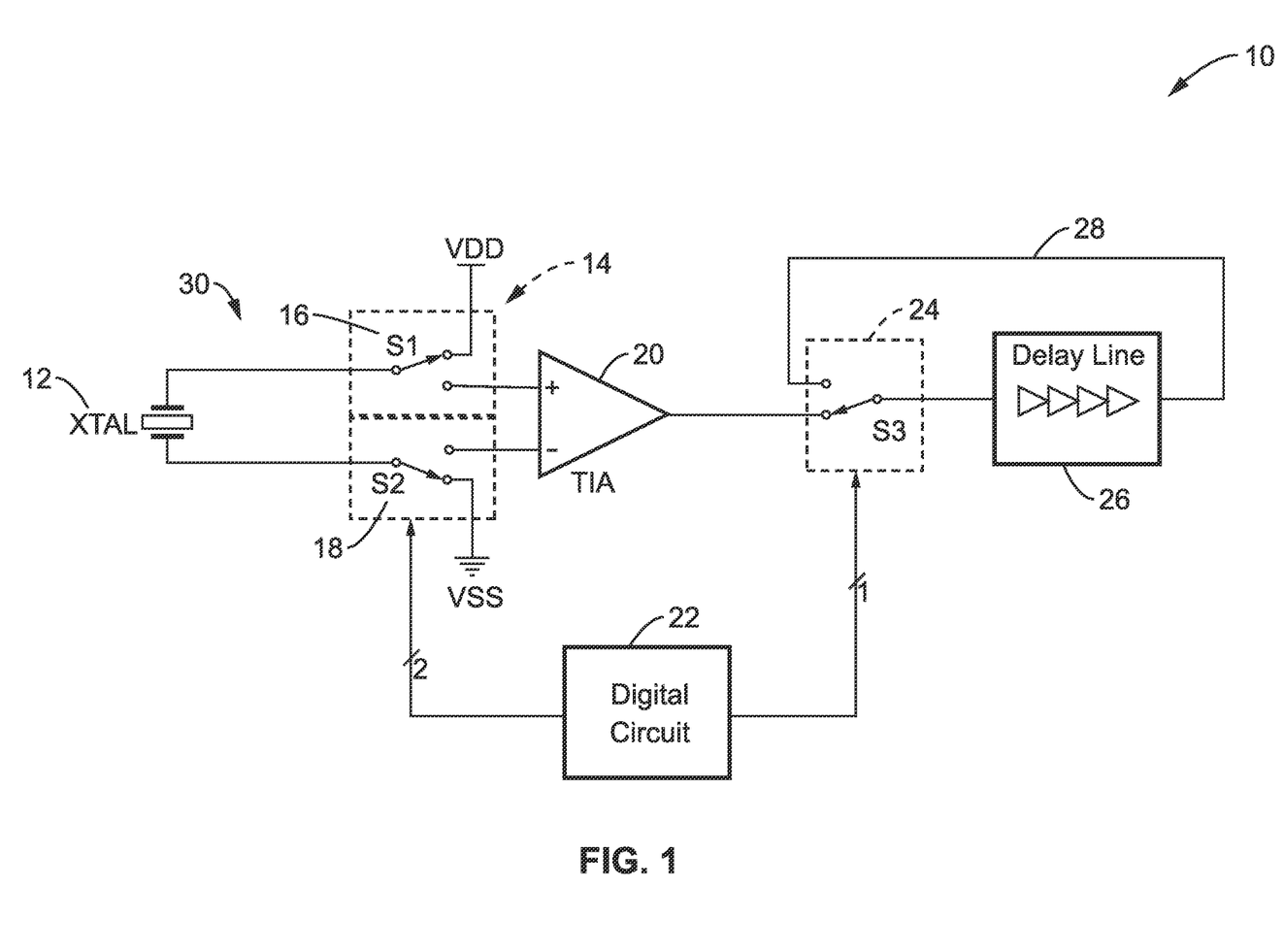
FIG. 1 through FIG. 4 are schematic diagrams of a fast start oscillator according to an embodiment of the present disclosure.

An example circuit is depicted with a high-Q resonator 12, exemplified here as a crystal, which is coupled to a switching circuit 14, shown with a first switch (S1) 16, and a second switch (S2) 18. It will be noted that high-Q refers to a high quality factor which expresses how underdamped the resonator is. The higher the Q, the lower the rate of energy loss in the resonator and longer it will ring before the oscillations cease (die out).

The switches allow reconnecting the resonator to (1) different sources (e.g., $V_{DD}$ and $V_{SS}$) and (2) to a trans-impedance amplifier (TIA) 20 whose output is connected through a switch circuit 24 with switch (S3) to a delay line 26, having a feedback path 28. A digital circuit 22 controls the timing of the switch operations.

Figure 2:
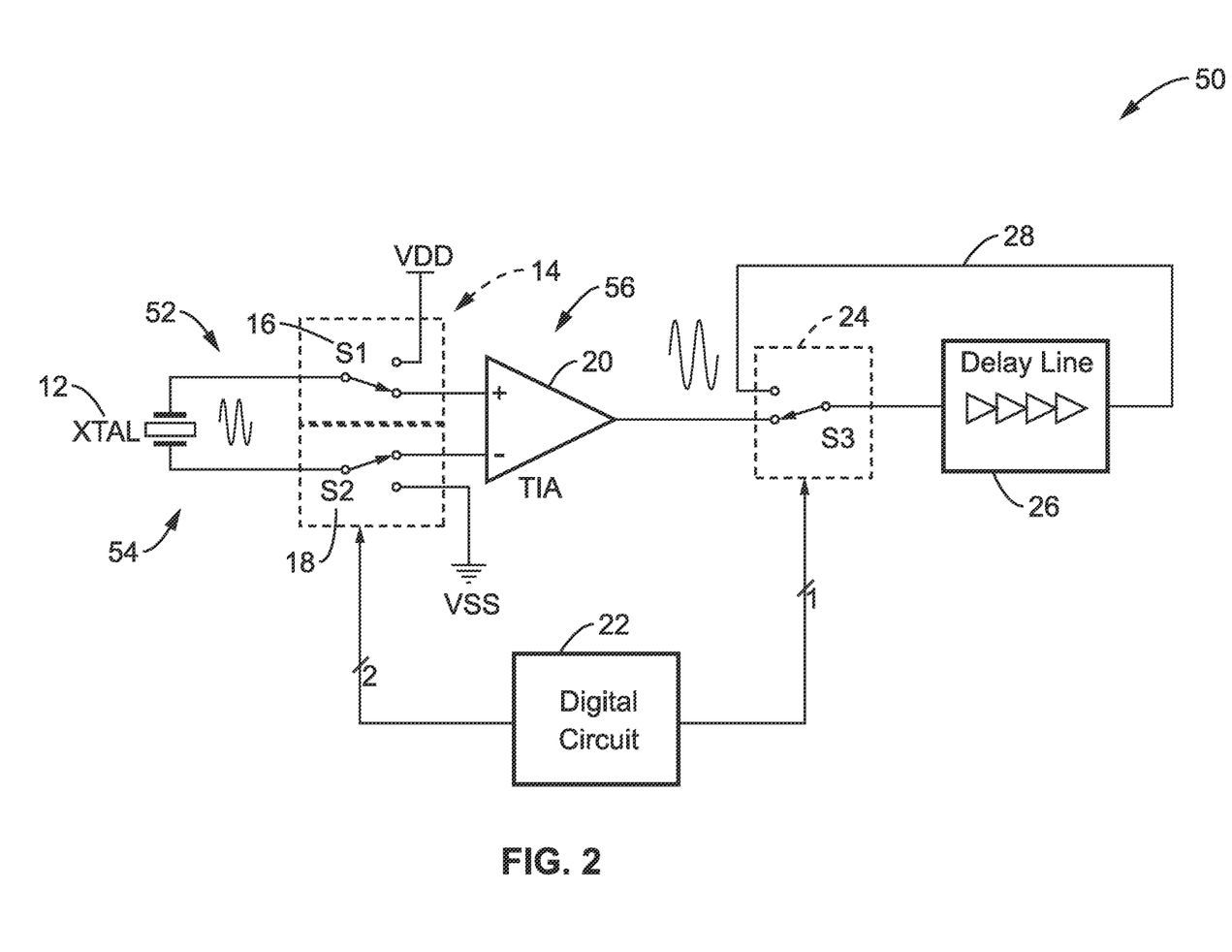

In FIG. 1 the crystal 12 is seen in an initial state 30 with an applied voltage $V_{DD}$ ($V_{DD}$–$V_{SS}$) as the switches are connected to different voltages, exemplified as drain $V_{DD}$ and source $V_{SS}$ voltages. Then, as depicted in FIG. 2, a start signal switches 52 (through switches 16, 18) the crystal (resonator) to connect to the amplifier, here exemplified as a Trans-Impedance Amplifier (TIA) 20, thereby applying a voltage step to it. As a result of this step voltage, the resonator (crystal) responds by producing a ringing signal (e.g., a sinusoidal current) 54 that rings at the resonant frequency of the resonator, and is seen amplified 56 with the TIA amplifying the step response of the resonator, at the output of the amplification stage 20 (e.g., TIA). It should be appreciated that the present disclosure can be configured for use with any type of waveform, such as sin, square, triangle and so forth without departing from the present teachings. Due to the high Q of the resonator (crystal), this response decays very slowly.

It should be noted that FIG. 2 shows only one of the ways of applying a voltage step to the crystal (resonator). In the example implementation of FIG. 2, the crystal starts with a potential difference of $V_{DD}$ across it, which then goes to zero as both terminals of the crystal are connected to the input of a differential TIA. This results in a negative step of $V_{DD}$ being applied to the crystal. In another embodiment, both terminals of the crystals could start at $V_{SS}$ and then only one terminal need be connected to the amplifier, such as a single-ended TIA. This results in a positive voltage step with a step value equal to the input common-mode voltage of the TIA. The purpose of the switching depicted in FIG. 2 is to apply a voltage step across the resonator (crystal), regardless of the direction and magnitude of the voltage step, as long as the amount of step applied is sufficient to produce the amount of input current that the TIA requires to generate a sufficient signal for the locking circuit to obtain a lock. Furthermore, it will be noted that the TIA represents any amplifying stage (or stages), whereby the TIA may be replaced with other active amplification circuits, for example a voltage amplifier. A load, such as resistor, in series with the crystal can accomplish the current-to-voltage conversion for the voltage amplifier. The voltage step magnitude and the amplifying stage topology is designed to satisfy the noise and jitter requirements. FIG. 2 shows one of the solutions that satisfy the jitter requirements.

The ringing response of the resonator (e.g., crystal) is amplified, such as by a trans-impedance amplifier (TIA), that has been designed to operate with low noise and jitter. It will be noted that timing jitter can create error in the delay of the locked delay-line described below. The TIA is preferably configured to maintain an rms jitter which is less than about 0.1% of the crystal resonance period. In at least one embodiment, a first stage of the TIA comprises two self-biased inverters; with a second stage that can be used to further amplify the signal if desired. Digital buffers after the amplifier (e.g., TIA) can be used to produce a square-wave signal at the required frequency.

Figure 3:
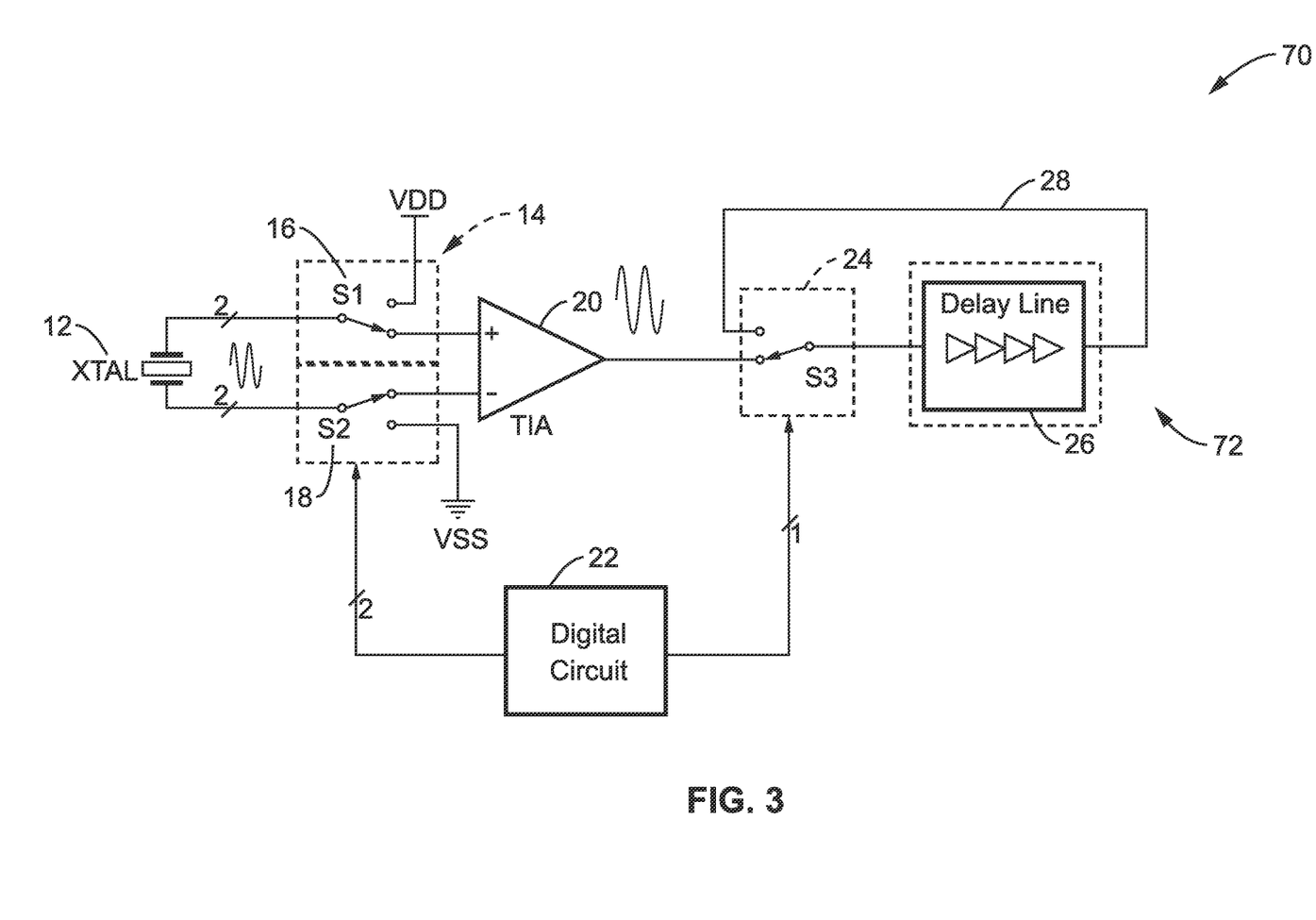

Next, as depicted in FIG. 3, this amplified signal passes through S3 24 and is used for locking 72 the frequency, exemplified here as adjusting a digital delay-line 26 such that the delay-line's delay is set equal to the period of the amplified signal from the resonator. Preferably this is done by tuning the delay to match (half of) the crystal resonance period to achieve sub-1000 ppm accuracy within less than 5 cycles.

Figure 4:
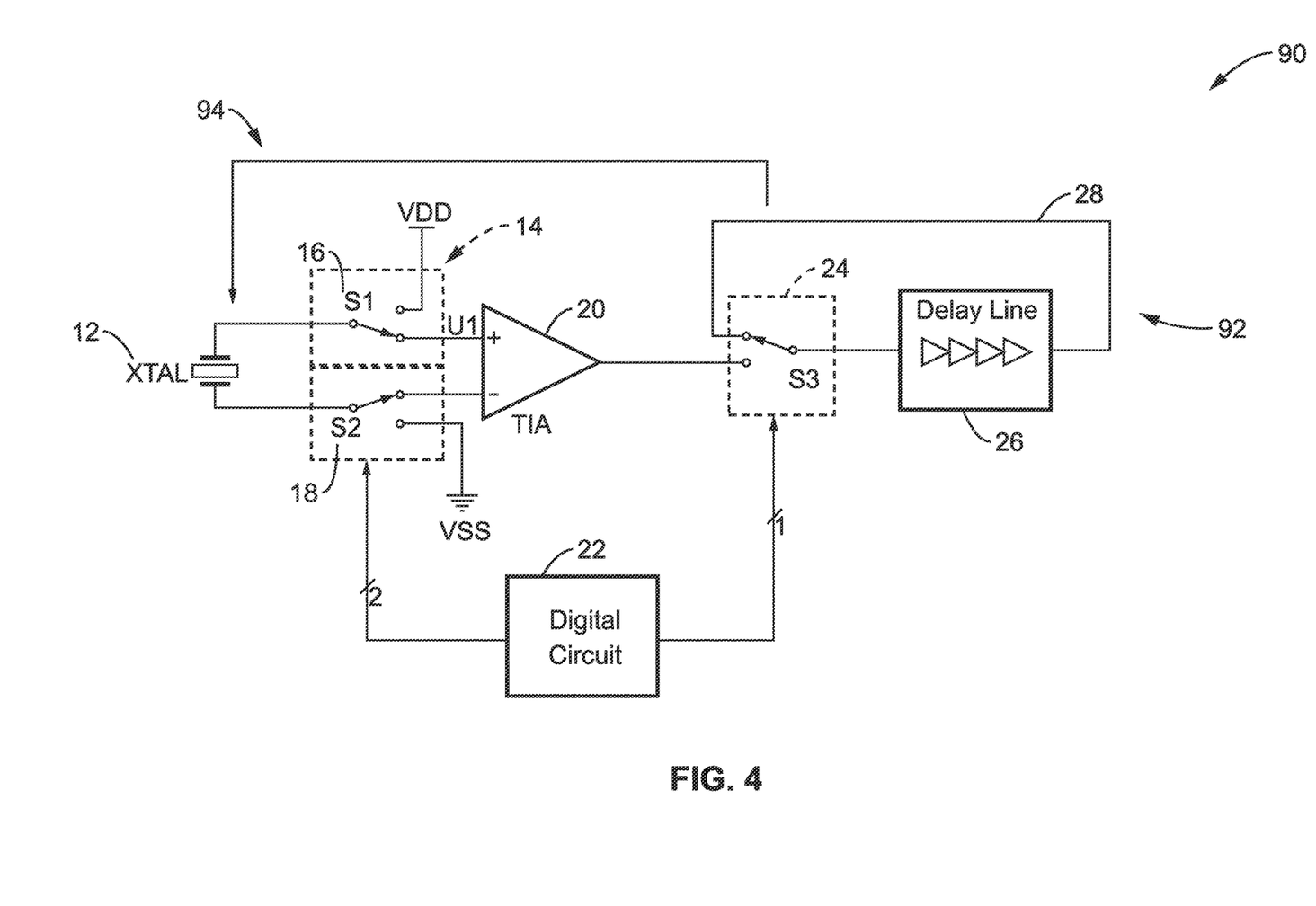

Finally, in FIG. 4, once the delay is configured as per the above method, the delay line is switched into an oscillator mode 92, such as a ring oscillator or any of the numerous forms of oscillators as will be known to one of ordinary skill in the art. In the oscillator mode, the startup locking circuit operates as injection oscillator which oscillates near the resonant frequency of the resonator (e.g., crystal), for examples with a resolution determined by the last stage of the delay line and preferably within +−1000 ppm of the resonant frequency of the crystal. The output of this configured oscillator is then connected for injecting a signal for energizing 94 the resonator (e.g., crystal) to achieve quick startup of the primary oscillator circuit.

Summarizing the steps performed the figures depicted the resonator of the primary oscillator being first connected 30 in FIG. 1 with a voltage across at least one side, then a switching circuit changes state 52 in FIG. 2 in connecting the resonator to an amplifier input, which applies a voltage step to the resonator, which responds by producing a ringing signal 54, which is amplified 56. Then in FIG. 3 the amplified ringing passes through a switch to a locking circuit, exemplified as a delay line, which locks 72 to the amplified ringing response. Then, as seen in FIG. 4 the locking circuit is then re-configured 92 as an injection oscillator and has an output which is fed back 94 to energize the resonator of the primary oscillator and thus rapidly start the primary oscillator.

The exemplified delay line can be embodied in a locking circuit which can detect and lock to an input frequency, and then 'remember' and thus set itself to produce an output at the same frequency. After locking is achieved, the locking circuit is then switched into an injection oscillator mode which injects a signal for starting the primary oscillator.

The delay line as exemplified is a quick locking delay line which preferably comprises multiple stages, such as comprising three stages, with each stage having a progressively finer resolution.

Figure 5:
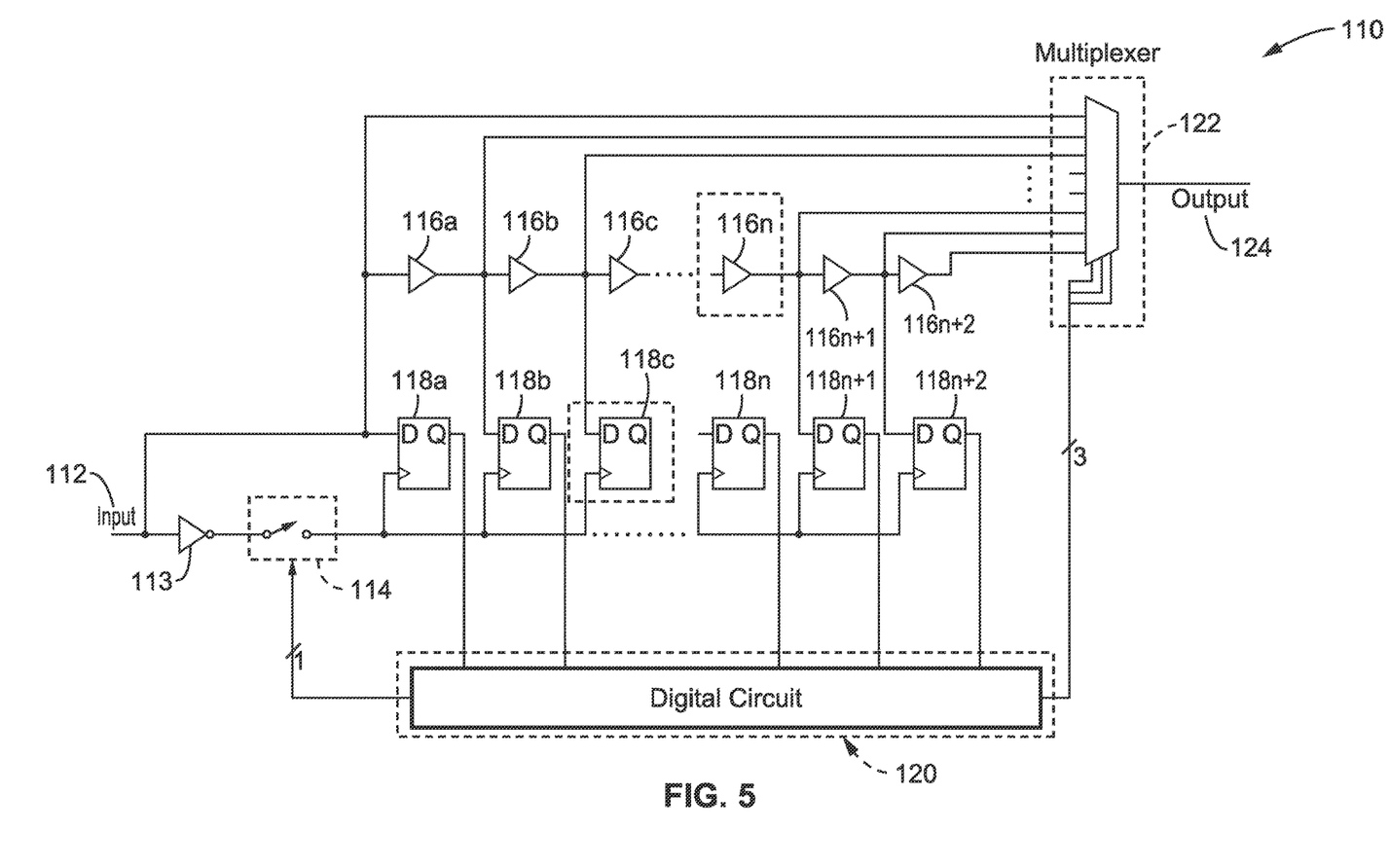
FIG. 5 is schematic diagram of an embodiment of a delay line stage according to an embodiment of the present disclosure.

FIG. 5 illustrates an embodiment 110 of a single delay line stage. A sequence of buffers 116a through 116n+2, each with its associated flip-flop (FF) 118a through 118n+2, are shown with the data input (D) of each FF connected to the input of its associated buffer and also connecting to one of the inputs of a multiplexor 122.

The input is used for clocking the clock inputs of the flip flops. In at least one embodiment, input 112 is seen connecting to an inverter 113 to drive the clock inputs. In addition, at least one embodiment the clock (or its inverse) passes through switch 114 out to the clock inputs of the Data FFs 118a through 118n+2. The D input of the first FF is also connected to input 112. A digital circuit 120 is shown receiving the Q output from each of the D FFs and outputting control signals to control which of the inputs to multiplexor 122 is selected as output 124.

Each delay line stage comprises two current starved inverters configured in a way to produce a current starved buffer. Thus, each of the buffers has the two current starved inverters for incurring a delay. One such buffer is labelled 116n and is used as the delay-element to produce the required delay in the delay-line. The current through the buffer is set according to how much delay is needed, and it is set at design time. The required delay depends on the resolution required for that stage of the delay line. Different resonator frequencies require different delay resolutions to get a sub-1000 ppm accuracy.

It should be appreciated that the type and specific number of flip flops and buffers utilized may be altered without departing from the teachings of the present disclosure insofar as proper corrections are made as necessary to operate in the general manner described herein.

Using digital logic, it is determined how many stages are required to produce a delay that is close to the period of the input signal. That digital logic 120 controls the state of switch 114 and also determines how far along the delay line the input signal has propagated. This is performed in the examples presented herein using a chain of flip-flops, one of which is labelled as 118c in the figure.

In the embodiment shown switch 114 is initially open to prevent the first rising-edge from the input from triggering the flip flops. This is to ensure that the first edge is only utilized to propagate a signal through the delay line. As the first rising-edge propagates through the delay line, the digital circuit 120 closes the switch 114. Therefore, the next rising-edge from the input will trigger all flip-flops at the same time. Accordingly, the output from the flip-flops contains information about how far the signal traveled through the delay line from the first rising-edge to the second.

In at least one embodiment, the digital circuit can be, or incorporate, a priority decoder that takes in a "thermometer code" as produced by the chain (series) of flip-flops and outputs a multiplexer control code, or signals, that would select the internal node in the delay line that most closely matches the period of the delay line. It will be noted that a so called "thermometer code" is a unary coding in which a natural number is represented by a first given number of binary digits of a first state being following by a second given number of binary digits of a second state.

In that way, the priority decoder of the digital circuit output controls signals to the multiplexer such that the delay from the input of the delay line to the output 124 of the multiplexer is less than or equal to the period of the input signal to within the resolution of the delay line. The clock to the digital circuit 120 is an inverted version of the same amplified ringing response; thus, the digital circuit does not require a separate clock source. The output of the multiplexer is then passed on to another stage of the delay-line which preferably has a higher resolution (e.g., set by reducing the delay of the current-starved buffer by increasing the current though it). In this embodiment, three stages of delay-lines are used with progressively finer resolutions.

It should also be appreciated that more than one delay line stage could be utilized with the same resolution as its preceding stage, without departing from the present disclosure. However, in general a design with progressively finer resolutions can attain the desired accuracy with less required hardware.

As an example, a 10 MHz crystal requires a sub 100 picosecond delay error in the driving signal to have a sub 1000 ppm accuracy. So, the resolution of the first, second and third stage can be 8 nanoseconds, 800 picoseconds, and 80 picoseconds respectively. The number of delay-elements and the delay per delay-elements for the first delay-line stage is such that it can produce a total delay of more than the period of the input signal. The resolution of the final delay-line stage sets the resolution of the overall-system. Each successive stage has a delay that is more than the delay of each individual delay-element of the last stage in order to ensure sufficient overlap. The exact delays depend on the resonator (e.g., crystal) frequency and the required accuracy. Since each delay line stage requires 2 cycles for locking, the three stages thus require a total of 6 cycles to lock. Additional stages can be added for better accuracy at the expense of more time required for locking; while similarly the number of stages can be reduced for more rapid locking at the expense of lower accuracy.

After the locking is complete, the delay-line is reconfigured in at least one embodiment as an oscillator (e.g., ring oscillator, or other oscillator form). However, in this embodiment of a ring oscillator, since the delay of the delay-line is equal to the period of the input signal, the final frequency that the reconfigured delay-line ring oscillator will produce is equal to half the resonance frequency of the crystal. A frequency-doubler is therefore utilized. In this embodiment, the final frequency is doubled by using the output node and an internal node of the delay line connected through an XOR gate. This is a common technique used to achieve frequency doubling. Another way to achieve frequency doubling is to add a pulse-generator to the feedback path while reconfiguring the delay line as a ring oscillator. It should be appreciated that any pulse-generation circuit topology can be used, or adapted for use, without departing from the teachings of the present disclosure. The pulse width can be set by the internal node of the delay-line which was also used in the XOR gate implementation.

It should also be appreciated that the present technology can lock to a function of the period, to maintain synchronization with the period of the ringing response in different ways. For example, it may lock to its actual period, to an integer number of periods n, or to an inverse of the number of periods (e.g., 1/n), insofar as the locked output is then multiplied by the same factor before the signal is injected to start the primary oscillator. It should be noted that for an inverse number of periods it is not the period information that the system is locking to, but rather the duty cycle. If we have a 50% duty cycle signal, it will lock to half a period. In general, for a d % duty cycles input, the hardware can lock to d/100th of a period. So, for a signal with a duty cycle that is not well defined, it will only be useful to lock to a period, or an integer multiple of it.

The purpose of the delay line in FIG. 5 is to lock to the input signal. This can be performed in a variety of ways, only one of which is shown in FIG. 5. For example, the delay-locked loop could be controlled in either an analog and/or digital manner. Other ways of locking can be utilized, such as an analog phase-locked loop, digital phase-locked loop, analog frequency-locked loop, digital frequency-locked loop, or an injection locked stage. The purpose and function of the frequency-locking stage remains the same regardless of the type of structure utilized. The delay-line presented in FIG. 5 is one that is capable of performing these operations quickly and having low energy consumption and a high frequency accuracy.

While FIG. 5 shows one implementation of the delay line, it can be configured in other ways. For example, if all the flip-flops in the chain in FIG. 5 are replaced by negative-edge triggered flip-flops, then the delay line will match to half the period of the input. Such a configuration eliminates the need for frequency doubling at the expense of more susceptibility to duty cycle variations.

Figure 6:
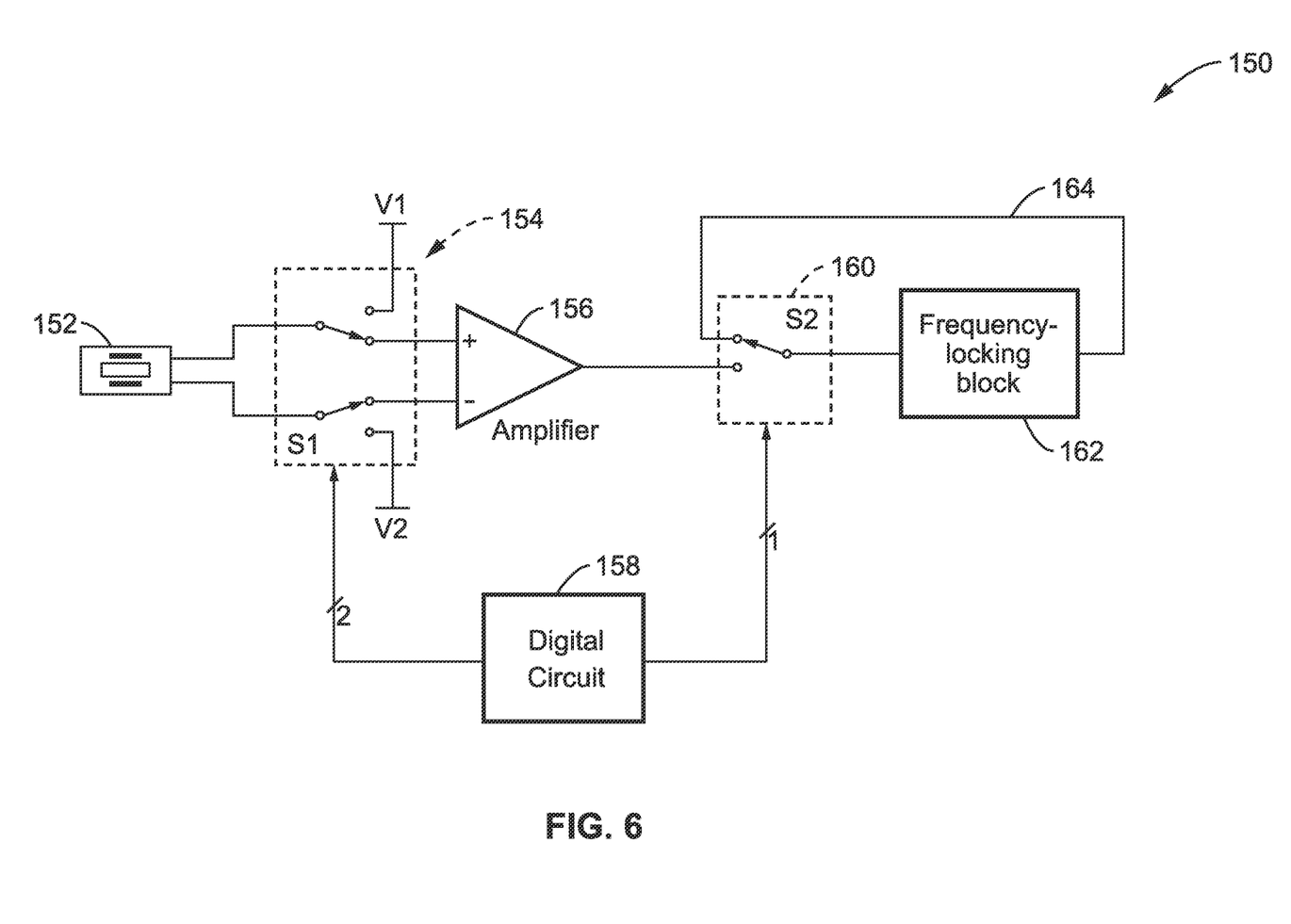
FIG. 6 is a schematic diagram showing a general fast startup circuit configuration according to an embodiment of the present disclosure.

FIG. 6 illustrates an example embodiment 150 for a general structure of the quick-startup circuitry. The circuit has the ability of applying a voltage step across the resonator, such as the exemplified crystal. In FIG. 6 the resonator 152 (e.g., crystal, or other high-Q resonator) and the voltage step can be applied through a set of switches 154. Changing the switch configuration can change the voltage across the resonator from V1-V2 to 0. In this way, changing the state of the switches thus applies a voltage step across the resonator (crystal). This causes the resonator to produce sinusoidal ringing current, which can be amplified with an amplifier 156. By way of example the amplifier may be a TIA to amplify the current directly, or a voltage amplifier with a resistor in series with the resonator to achieve the current-to-voltage conversion. Any amplifier topology that amplifies the signal can be used if it meets the jitter and noise requirements for the application. Output from amplifier 156 is directed through at least one switch 160.

The frequency-locking block 162 in FIG. 6 can take the signal from the amplifier, through switch 160, as a reference and lock to it. This block 162 can be implemented by way of example and not limitation as a digital or analog delay line, a digital or analog frequency locked loop, or a digital or analog phase locked loop, or similar circuit to allow locking the frequency. Once the locking is performed, then switch (or switches) 160 reconfigures the frequency-locking block as a standalone oscillator with feedback loop 164 between the output and switch (or switches) 160. The switching 154 and 160 are preferably controlled by a digital circuit 158, while the frequency-locking block 162 may have its own analog and/or digital circuitry for control, or may operate in conjunction with digital circuit 158.

Figure 7:
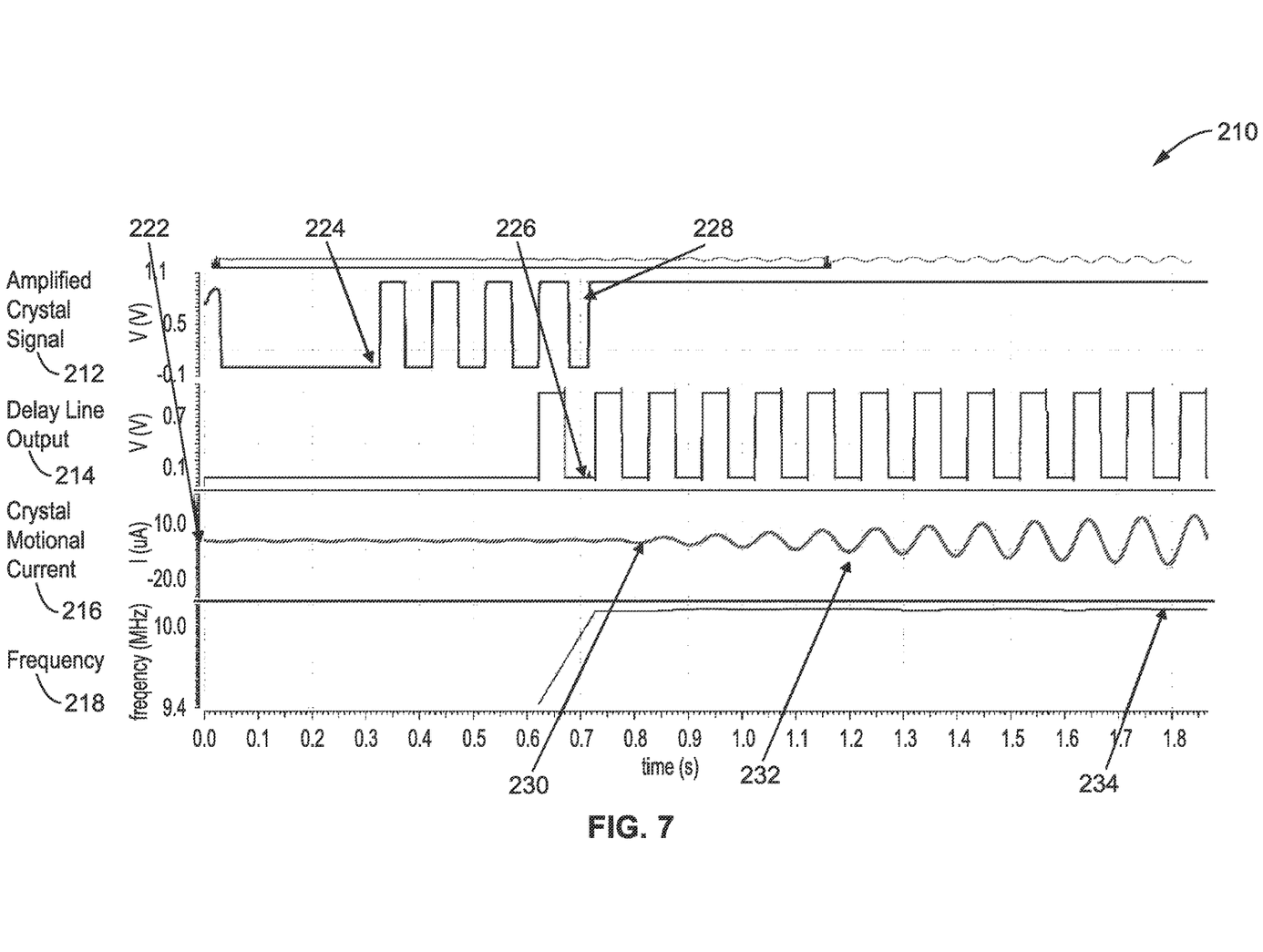
FIG. 7 is a waveform plot depicting signals present during oscillator startup as obtained for an embodiment of the present disclosure.

FIG. 7 illustrate example results 210 obtained from an embodiment of the present disclosure. The plots depict amplified crystal signal 212, delay line output 214, crystal motional current 216 and frequency 218 during the process of performing the disclosed fast startup of a high-Q oscillator. Different steps along this process are noted in the figure, such as: applying the voltage step 222 (e.g., at t=0) to the resonator; crystal current being amplified 224 using the TIA; delay line locking 226 in four cycles after which delay line changes to a ring oscillator (or similar for maintaining oscillation); TIA being turned off 228; oscillator output being injected 230 into the crystal; injection continuing 232 (e.g., for about 100 cycles) as crystal motional current rises; and showing that crystal frequency 234 of 10.1 MHz with a locked frequency of 10.11 MHz, which is less than a 1000 ppm difference.

General Scope of the Embodiments

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure (s) algorithm(s), step(s), operation(s), formula(e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, that the terms processor, hardware processor, computer processor, central processing unit (CPU), and computer are used synonymously to denote a device capable of executing the instructions and communicating with input/output interfaces and/or peripheral devices, and that the terms processor, hardware processor, computer processor, CPU, and computer are intended to encompass single or multiple devices, single core and multicore devices, and variations thereof.

From the description herein, it will be appreciated that the present disclosure encompasses multiple implementations of the technology which include, but are not limited to, the following:

A fast startup oscillator apparatus, comprising: (a) an amplifier; (b) a locking circuit that is reconfigurable as an injection oscillator circuit; (c) a first switching circuit configured for connecting a resonator of a primary oscillator to at least one voltage source, and otherwise to said amplifier; (d) a second switching circuit configured for changing said locking circuit between performing locking and operating as said injection oscillator; (e) wherein switching said resonator from said at least one voltage source to said amplifier induces a voltage step to the resonator of the primary oscillator, thus causing the resonator to generate a ringing response having a given period; (f) wherein the ringing response is amplified by the amplifier which outputs an amplified ringing response; (g) wherein the amplified ringing response configures the locking circuit to lock in synchronization with the amplified ringing response; (h) wherein the locking circuit is then reconfigured as said injection oscillator; and (i) wherein an output signal from the injection oscillator is configured to be injected into said primary oscillator containing said resonator, for starting up said primary oscillator in response to receiving the output from said injection oscillator.

A fast startup oscillator apparatus, comprising: (a) an amplifier; (b) a frequency locking circuit that is reconfigurable as an injection oscillator circuit; wherein said locking circuit is configured to detect and lock to an input frequency, and set itself to produce that same frequency as an output, and then be switched into the injection oscillator circuit mode for starting a primary oscillator; (c) a first switching circuit configured for connecting a resonator of the primary oscillator to at least one voltage source, and otherwise to said amplifier; (d) a second switching circuit configured for changing said locking circuit between performing locking and operating as said injection oscillator; (e) wherein switching said resonator from said at least one voltage source to said amplifier induces a voltage step to the resonator of the primary oscillator, thus causing the resonator to generate a ringing response having a given period; (f) wherein the ringing response is amplified by the amplifier which outputs an amplified ringing response; (g) wherein the amplified ringing response configures the locking circuit to lock in synchronization with said amplified ringing response; (h) wherein said locking circuit comprises a quick locking delay line configured to automatically adjust its delay to be a function of the period, of the amplified signal from the resonator; and said quick locking delay line comprises either a single delay line stage, or multiple delay line stages connected in series with each successive delay-line stage having a higher resolution; (i) wherein the locking circuit is then reconfigured as said injection oscillator; and (j) wherein an output signal from the injection oscillator is configured to be injected into said primary oscillator containing said resonator, for starting up said primary oscillator in response to receiving the output from said injection oscillator.

A method for fast startup of a high-Q oscillator, the method comprising: (a) triggering a resonator of a primary oscillator to generate a ringing signal, having a frequency, by applying a voltage step to the resonator; (b) locking onto the frequency of said ringing signal; (c) outputting said ringing signal in an injection oscillator at an injection frequency substantially matching the frequency of the ringing signal; and (d) coupling said injection frequency to a resonator of the primary oscillator, for starting the primary oscillator.

A quick locking delay circuit, comprising: (a) at least one delay line stage, wherein if multiple delay line stages are utilized they are connected in series; (b) wherein each said delay line stage, comprises: (b)(i) a delay line input configured for connection to a ringing signal being received from the resonator of the primary oscillator; (b)(ii) a digital multiplexor; (b)(iii) a digital control circuit; (b)(iv) a series of buffers, each of said buffers having an associated flip-flop (FF) with data input, clock input and a FF output; (b)(v) a first of said buffers having its buffer input connected to said delay line input, and subsequent buffers connected in series, and in which the output of each of said buffers connects to a different input of said digital multiplexor; (b)(vi) a first of said FFs having its data input connected to said delay line input, and subsequent FFs having their data input connected to the output of a previous buffer, and outputs connecting to the digital control circuit; (b)(vii) wherein transitions of the input are utilized for clocking each of said FFs; (b)(viii) wherein each of said buffers comprises a current starved buffer as a delay element to produce the required delay in the delay-line; and (b)(ix) wherein said digital control circuit is configured for receiving the FF output from each of the FFs and outputting control signals to control which of the inputs are directed through multiplexor as an output; and (b)(x) wherein said quick locking delay line is configured to automatically adjust its delay to be equal to the period, or a half of the period, of the amplified signal from the resonator.

The apparatus of claim 1, wherein said locking circuit locks with the ringing response by locking to an integer number of periods, or its inverse, of the amplified ringing response on the condition that the output signal from the injection oscillator is multiplied by that same factor before being injected into the primary oscillator.

The apparatus or method of any preceding implementation, wherein the resonator of the primary oscillator comprises a crystal or other high quality (high-Q) resonator.

The apparatus or method of any preceding implementation, wherein said first switching circuit is configured for applying a voltage step across the resonator of the primary oscillator, regardless of the direction and magnitude of the voltage step, as long as the amount of the voltage step being applied is sufficient to produce the amount of input current that the amplifier requires for generating a signal that can be locked by the locking circuit.

The apparatus or method of any preceding implementation, wherein said first switching circuit is configured for connecting each of two leads from the resonator to a different voltage source, and otherwise connecting each of these leads to said amplifier.

The apparatus or method of any preceding implementation, wherein said first switching circuit is configured for connecting a first of the two leads from the resonator to a voltage source having a voltage differing from the voltage to which the second of the two leads from the resonator is being held, and otherwise connecting said first of the two leads to said amplifier.

The apparatus or method of any preceding implementation, wherein said amplifier comprises an active amplification circuit.

The apparatus or method of any preceding implementation, wherein said active amplification circuit comprises one or more amplifier stages.

The apparatus or method of any preceding implementation, wherein said active amplification circuit comprises a trans-impedance amplifier (TIA), or a voltage amplifier.

The apparatus or method of any preceding implementation, further comprising one or more digital buffer circuits after said amplifier circuit for converting the output from said amplifier circuit to a square-wave signal at the required frequency.

The apparatus or method of any preceding implementation, wherein said locking circuit is configured to detect and lock to an input frequency, and set itself to produce that same frequency as an output, and then be switched into an injection oscillator mode for starting a primary oscillator.

The apparatus or method of any preceding implementation, wherein said locking circuit is selected form the group of frequency locking circuit consisting of analog phase-locked loops, digital phase-locked loops, analog frequency-locked loops, digital frequency-locked loops, and injection locked stages.

The apparatus or method of any preceding implementation, wherein said locking circuit comprises a quick locking delay line.

The apparatus or method of any preceding implementation, wherein said quick locking delay line is configured to automatically adjust its delay to be equal to the period, or half of the period, of the amplified signal from the resonator.

The apparatus or method of any preceding implementation, wherein said quick locking delay line comprises either a single delay line stage, or multiple delay line stages connected in series with each successive delay-line stage having a higher resolution.

The apparatus or method of any preceding implementation, wherein each said delay line stage, comprises: (a) a delay line input configured for connection to a ringing signal being received from the resonator of the primary oscillator; (b) a digital multiplexor; (c) a digital control circuit; (d) a series of buffers, each of said buffers having an associated flip-flop (FF) with data input, clock input and a FF output; (e) a first of said buffers having its buffer input connected to said delay line input, and subsequent buffers connected in series, and in which the output of each said buffers connects to a different input of said digital multiplexor; (f) a first of said FFs having its data input connected to said delay line input, and subsequent FFs having their data input connected to the output of a previous buffer, and outputs connecting to the digital control circuit; (g) wherein transitions of the input are utilized for clocking each of said FFs; (h) wherein each of said buffers comprises a current starved buffer as a delay element to produce the required delay in the delay-line; and (i) wherein said digital control circuit is configured for receiving the FF output from each of the FFs and outputting control signals to control which of the inputs are directed through multiplexor as an output.

The apparatus or method of any preceding implementation, wherein said input line can be inverted to drive the clock inputs of each of said FFs.

The apparatus or method of any preceding implementation, further comprising: (a) a switch which switches said input line connection to the clock input of said FFs; (b) wherein said switch is initially open to prevent the first edge from said input line from triggering the flip flops, so that only the first edge is utilized to propagate a signal through the delay line; and (c) wherein after said first edge propagates through the delay line, said switch is closed so that all edges are propagated.

The apparatus or method of any preceding implementation, wherein said apparatus enables fast startup of the primary oscillator, which is a crystal and other high-Q oscillator, by automatically adjusting the injected startup oscillator frequency to accurately match the resonator frequency in the primary oscillator.

The apparatus or method of any preceding implementation, wherein said triggering a resonator of a primary oscillator is performed by connecting a resonator of the primary oscillator to at least one voltage source, and then to an amplifier where upon connecting to the amplifier a voltage step is applied to the resonator.

The apparatus or method of any preceding implementation, wherein said input line can be inverted to drive the clock inputs of each of said FFs.

The apparatus or method of any preceding implementation, further comprising: (a) a switch which switches said input line connection to the clock input of said FFs; (b) wherein said switch is initially open to prevent the first edge from said input line from triggering the flip flops, so that only the first edge is utilized to propagate a signal through the delay line; and (c) wherein after said first edge propagates through the delay line, said switch is closed so that all edges are propagated.

The apparatus or method of any preceding implementation, wherein each successive delay-line stage has a higher resolution.

As used herein, term "implementation" is intended to include, without limitation, embodiments, examples, or other forms of practicing the technology described herein.

As used herein, the singular terms "a," "an," and "the" may include plural referents unless the context clearly dictates otherwise. Reference to an object in the singular is not intended to mean "one and only one" unless explicitly so stated, but rather "one or more."

Phrasing constructs, such as "A, B and/or C", within the present disclosure describe where either A, B, or C can be present, or any combination of items A, B and C. Phrasing constructs indicating, such as "at least one of" followed by listing a group of elements, indicates that at least one of these group elements is present, which includes any possible combination of the listed elements as applicable.

References in this disclosure referring to "an embodiment", "at least one embodiment" or similar embodiment wording indicates that a particular feature, structure, or characteristic described in connection with a described embodiment is included in at least one embodiment of the present disclosure. Thus, these various embodiment phrases are not necessarily all referring to the same embodiment, or to a specific embodiment which differs from all the other embodiments being described. The embodiment phrasing should be construed to mean that the particular features, structures, or characteristics of a given embodiment may be combined in any suitable manner in one or more embodiments of the disclosed apparatus, system or method.

As used herein, the term "set" refers to a collection of one or more objects. Thus, for example, a set of objects can include a single object or multiple objects.

Relational terms such as first and second, top and bottom, and the like may be used solely to distinguish one entity or action from another entity or action without necessarily requiring or implying any actual such relationship or order between such entities or actions.

The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element.

As used herein, the terms "approximately", "approximate", "substantially", "essentially", and "about", or any other version thereof, are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

The term "coupled" as used herein is defined as connected, although not necessarily directly and not necessarily mechanically. A device or structure that is "configured" in a certain way is configured in at least that way, but may also be configured in ways that are not listed.

Benefits, advantages, solutions to problems, and any element(s) that may cause any benefit, advantage, or solution to occur or become more pronounced are not to be construed as a critical, required, or essential features or elements of the technology describes herein or any or all the claims.

In addition, in the foregoing disclosure various features may grouped together in various embodiments for the purpose of streamlining the disclosure. This method of disclosure is not to be interpreted as reflecting an intention that the claimed embodiments require more features than are expressly recited in each claim. Inventive subject matter can lie in less than all features of a single disclosed embodiment.

The abstract of the disclosure is provided to allow the reader to quickly ascertain the nature of the technical disclosure. It is submitted with the understanding that it will not be used to interpret or limit the scope or meaning of the claims.

It will be appreciated that the practice of some jurisdictions may require deletion of one or more portions of the disclosure after that application is filed. Accordingly, the reader should consult the application as filed for the original content of the disclosure. Any deletion of content of the disclosure should not be construed as a disclaimer, forfeiture, or dedication to the public of any subject matter of the application as originally filed.

The following claims are hereby incorporated into the disclosure, with each claim standing on its own as a separately claimed subject matter.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A fast startup oscillator apparatus, comprising:
   (a) an amplifier;
   (b) a locking circuit that is reconfigurable as an injection oscillator circuit;
   (c) a first switching circuit configured for connecting a resonator of a primary oscillator to at least one voltage source, and otherwise to said amplifier;
   (d) a second switching circuit configured for changing said locking circuit between performing locking and operating as said injection oscillator;

(e) wherein switching said resonator from said at least one voltage source to said amplifier induces a voltage step to the resonator of the primary oscillator, thus causing the resonator to generate a ringing response having a given period;

(f) wherein the ringing response is amplified by the amplifier which outputs an amplified ringing response;

(g) wherein the amplified ringing response configures the locking circuit to lock in synchronization with the amplified ringing response;

(h) wherein the locking circuit is then reconfigured as said injection oscillator;

(i) wherein an output signal from the injection oscillator is configured to be injected into said primary oscillator containing said resonator, for starting up said primary oscillator in response to receiving the output from said injection oscillator; and (j) wherein said locking circuit locks with the ringing response by locking to an integer number of periods, or its inverse, of the amplified ringing response on the condition that the output signal from the injection oscillator is multiplied by that same factor before being injected into the primary oscillator.

2. The apparatus of claim 1, wherein the resonator of the primary oscillator comprises a crystal or other high quality (high-Q) resonator.

3. The apparatus of claim 1, wherein said first switching circuit is configured for applying a voltage step across the resonator of the primary oscillator, regardless of the direction and magnitude of the voltage step, as long as the amount of the voltage step being applied is sufficient to produce the amount of input current that the amplifier requires for generating a signal that can be locked by the locking circuit.

4. The apparatus of claim 1, wherein said amplifier comprises an active amplification circuit.

5. The apparatus of claim 4, wherein said active amplification circuit comprises one or more amplifier stages.

6. The apparatus of claim 4, wherein said active amplification circuit comprises a trans-impedance amplifier (TIA), or a voltage amplifier.

7. The apparatus of claim 1, further comprising one or more digital buffer circuits after said amplifier circuit for converting the output from said amplifier circuit to a square-wave signal at the required frequency.

8. The apparatus of claim 1, wherein said locking circuit comprises a quick locking delay line.

9. The apparatus of claim 8, wherein said quick locking delay line is configured to automatically adjust its delay to be equal to the period, or half of the period, of the amplified signal from the resonator.

10. A fast startup oscillator apparatus, comprising:
(a) an amplifier;
(b) a locking circuit that is reconfigurable as an injection oscillator circuit;
(c) a first switching circuit configured for connecting a resonator of a primary oscillator to at least one voltage source, and otherwise to said amplifier;
(d) a second switching circuit configured for changing said locking circuit between performing locking and operating as said injection oscillator;
(e) wherein switching said resonator from said at least one voltage source to said amplifier induces a voltage step to the resonator of the primary oscillator, thus causing the resonator to generate a ringing response having a given period;
(f) wherein the ringing response is amplified by the amplifier which outputs an amplified ringing response;
(g) wherein the amplified ringing response configures the locking circuit to lock in synchronization with the amplified ringing response;
(h) wherein the locking circuit is then reconfigured as said injection oscillator;
(i) wherein an output signal from the injection oscillator is configured to be injected into said primary oscillator containing said resonator, for starting up said primary oscillator in response to receiving the output from said injection oscillator; and
(j) wherein said first switching circuit is configured for connecting each of two leads from the resonator to a different voltage source, and otherwise connecting each of these leads to said amplifier.

11. A fast startup oscillator apparatus, comprising:
(a) an amplifier;
(b) a locking circuit that is reconfigurable as an injection oscillator circuit;
(c) a first switching circuit configured for connecting a resonator of a primary oscillator to at least one voltage source, and otherwise to said amplifier;
(d) a second switching circuit configured for changing said locking circuit between performing locking and operating as said injection oscillator;
(e) wherein switching said resonator from said at least one voltage source to said amplifier induces a voltage step to the resonator of the primary oscillator, thus causing the resonator to generate a ringing response having a given period;
(f) wherein the ringing response is amplified by the amplifier which outputs an amplified ringing response;
(g) wherein the amplified ringing response configures the locking circuit to lock in synchronization with the amplified ringing response;
(h) wherein the locking circuit is then reconfigured as said injection oscillator;
(i) wherein an output signal from the injection oscillator is configured to be injected into said primary oscillator containing said resonator, for starting up said primary oscillator in response to receiving the output from said injection oscillator; and
(j) wherein said first switching circuit is configured for connecting a first of the two leads from the resonator to a voltage source having a voltage differing from the voltage to which the second of the two leads from the resonator is being held, and otherwise connecting said first of the two leads to said amplifier.

12. A fast startup oscillator apparatus, comprising:
(a) an amplifier;
(b) a locking circuit that is reconfigurable as an injection oscillator circuit;
(c) a first switching circuit configured for connecting a resonator of a primary oscillator to at least one voltage source, and otherwise to said amplifier;
(d) a second switching circuit configured for changing said locking circuit between performing locking and operating as said injection oscillator;
(e) wherein switching said resonator from said at least one voltage source to said amplifier induces a voltage step to the resonator of the primary oscillator, thus causing the resonator to generate a ringing response having a given period;
(f) wherein the ringing response is amplified by the amplifier which outputs an amplified ringing response;
(g) wherein the amplified ringing response configures the locking circuit to lock in synchronization with the amplified ringing response;

(h) wherein the locking circuit is then reconfigured as said injection oscillator;

(i) wherein an output signal from the injection oscillator is configured to be injected into said primary oscillator containing said resonator, for starting up said primary oscillator in response to receiving the output from said injection oscillator; and (j) wherein said locking circuit is configured to detect and lock to an input frequency, and set itself to produce that same frequency as an output, and then be switched into an injection oscillator mode for starting a primary oscillator.

13. The apparatus of claim 12, wherein said locking circuit is selected form the group of frequency locking circuits consisting of analog phase-locked loops, digital phase-locked loops, analog frequency-locked loops, digital frequency-locked loops, and injection locked stages.

14. A fast startup oscillator apparatus, comprising:

(a) an amplifier;

(b) a locking circuit that is reconfigurable as an injection oscillator circuit;

(c) a first switching circuit configured for connecting a resonator of a primary oscillator to at least one voltage source, and otherwise to said amplifier;

(d) a second switching circuit configured for changing said locking circuit between performing locking and operating as said injection oscillator;

(e) wherein switching said resonator from said at least one voltage source to said amplifier induces a voltage step to the resonator of the primary oscillator, thus causing the resonator to generate a ringing response having a given period;

(f) wherein the ringing response is amplified by the amplifier which outputs an amplified ringing response;

(g) wherein the amplified ringing response configures the locking circuit to lock in synchronization with the amplified ringing response;

(h) wherein the locking circuit is then reconfigured as said injection oscillator;

(i) wherein an output signal from the injection oscillator is configured to be injected into said primary oscillator containing said resonator, for starting up said primary oscillator in response to receiving the output from said injection oscillator;

(j) wherein said locking circuit comprises a quick locking delay line; and (k) wherein said quick locking delay line comprises either a single delay line stage, or multiple delay line stages connected in series with each successive delay-line stage having a higher resolution.

15. The apparatus of claim 14, wherein each said delay line stage, comprises:

(a) a delay line input configured for connection to a ringing signal being received from the resonator of the primary oscillator;

(b) a digital multiplexor;

(c) a digital control circuit;

(d) a series of buffers, each of said buffers having an associated flip-flop (FF) with data input, clock input and a FF output;

(e) a first of said buffers having its buffer input connected to said delay line input, and subsequent buffers connected in series, and in which the output of each said buffers connects to a different input of said digital multiplexor;

(f) a first of said FFs having its data input connected to said delay line input, and subsequent FFs having their data input connected to the output of a previous buffer, and outputs connecting to the digital control circuit;

(g) wherein transitions of the input are utilized for clocking each of said FFs;

(h) wherein each of said buffers comprises a current starved buffer as a delay element to produce the required delay in the delay-line; and (i) wherein said digital control circuit is configured for receiving the FF output from each of the FFs and outputting control signals to control which of the inputs are directed through multiplexor as an output.

16. The apparatus of claim 14, wherein said input line can be inverted to drive the clock inputs of each of said FFs.

17. The apparatus of claim 14, further comprising:

(a) a switch which switches said input line connection to the clock input of said FFs;

(b) wherein said switch is initially open to prevent the first edge from said input line from triggering the flip flops, so that only the first edge is utilized to propagate a signal through the delay line; and (c) wherein after said first edge propagates through the delay line, said switch is closed so that all edges are propagated.

18. A fast startup oscillator apparatus, comprising:

(a) an amplifier;

(b) a frequency locking circuit that is reconfigurable as an injection oscillator circuit; wherein said locking circuit is configured to detect and lock to an input frequency, and set itself to produce that same frequency as an output, and then be switched into the injection oscillator circuit mode for starting a primary oscillator;

(c) a first switching circuit configured for connecting a resonator of the primary oscillator to at least one voltage source, and otherwise to said amplifier;

(d) a second switching circuit configured for changing said locking circuit between performing locking and operating as said injection oscillator;

(e) wherein switching said resonator from said at least one voltage source to said amplifier induces a voltage step to the resonator of the primary oscillator, thus causing the resonator to generate a ringing response having a given period;

(f) wherein the ringing response is amplified by the amplifier which outputs an amplified ringing response;

(g) wherein the amplified ringing response configures the locking circuit to lock in synchronization with said amplified ringing response;

(h) wherein said locking circuit comprises a quick locking delay line configured to automatically adjust its delay to be a function of the period, of the amplified signal from the resonator; and said quick locking delay line comprises either a single delay line stage, or multiple delay line stages connected in series with each successive delay-line stage having a higher resolution;

(i) wherein the locking circuit is then reconfigured as said injection oscillator; and (j) wherein an output signal from the injection oscillator is configured to be injected into said primary oscillator containing said resonator, for starting up said primary oscillator in response to receiving the output from said injection oscillator.

* * * * *